March 3, 1959 H. R. BADGER ET AL 2,876,277

ELECTRICAL COMPONENT MOUNTING APPARATUS

Filed Dec. 29, 1954 2 Sheets-Sheet 1

INVENTORS
HENRY R. BADGER
JOHN W. PRATT
CLARENCE WALTER.

BY [signature]
ATTORNEY

ELECTRICAL COMPONENT MOUNTING APPARATUS

Filed Dec. 29, 1954 2 Sheets-Sheet 2

INVENTORS
HENRY R. BADGER
JOHN W. PRATT
CLARENCE WALTER

BY

ATTORNEY 2,876,277
Patented Mar. 3, 1959

2,876,277

ELECTRICAL COMPONENT MOUNTING APPARATUS

Henry R. Badger, Endicott, John W. Pratt, Vestal, and Clarence Walter, Johnson City, N. Y., assignors to International Business Machines Corporation, New York, N. Y., a corporation of New York Application December 29, 1954, Serial No. 478,474

1 Claim. (Cl. 174—52)

This invention relates to means for supporting and containing electrical components and more particularly to a compacting of an electronic circuit in a pluggable unit.

It is an object of this invention to provide an electronic circuit which is mounted on a board with its components supported in a sealed enclosure provided with a plugging means for connecting the electronic circuit into a system.

It is another object of this invention to provide a mounting apparatus for supporting an electronic circuit and its components in secured and sealed relationship in a self-contained pluggable unit.

Still another object of this invention is to provide a frame adapted to carry an electronic circuit and its components in conjunction with a sealable enclosing can into which the frame is insertable.

A still further object of this invention is the provision of a mounting apparatus for holding electrical components of an electronic circuit supported in a metallic enclosure and cushioned against jarring and in good thermal conducting contact with said metallic enclosure.

Another object of this invention is to provide means for cooling electrical components mounted in condensed and compact form in an enclosure.

A further object of this invention is the provision of a simple electrical component mounting apparatus supporting an electronic circuit and its components in an easily assembled, secured enclosure.

These and other objects of this invention will become more apparent upon consideration of the following description taken together with the accompanying drawings, in which.

It is desirable to assemble an electronic circuit and its components into a compact package on a component board. Further, it is desirable to mount the circuit and its components securely against damage from jar or shock and to enclose the assembly in an enclosure which can be evacuated and made inert. In addition, it is desired to mount the electrical components so that heat may be rapidly conducted from the larger and hotter components. Moreover, it is even more desirable to provide the assembled electronic components in a single package which is attached into an electronic or electrical system by a simple plugging operation.

In general, this invention provides the means for mounting an electronic circuit on a spring band in a sealed can with the vacuum tubes and other large components mounted in spring clamps on the spring band, so that they may be cooled in good thermal conduction through the spring band and a metallic enclosure. The electronic circuit and its other components are mounted on a board which is fastened to the frame, inserted in the can, and the frame is supported in the can by the spring band with which it is assembled. A good thermal contact is provided between the spring band and a metallic enclosure in which the system is mounted. The frame is provided on one end with a lid for closing the can, and with a plug unit positioned in the lid for connection of the unit into an electronic system.

Figures 1, 2:
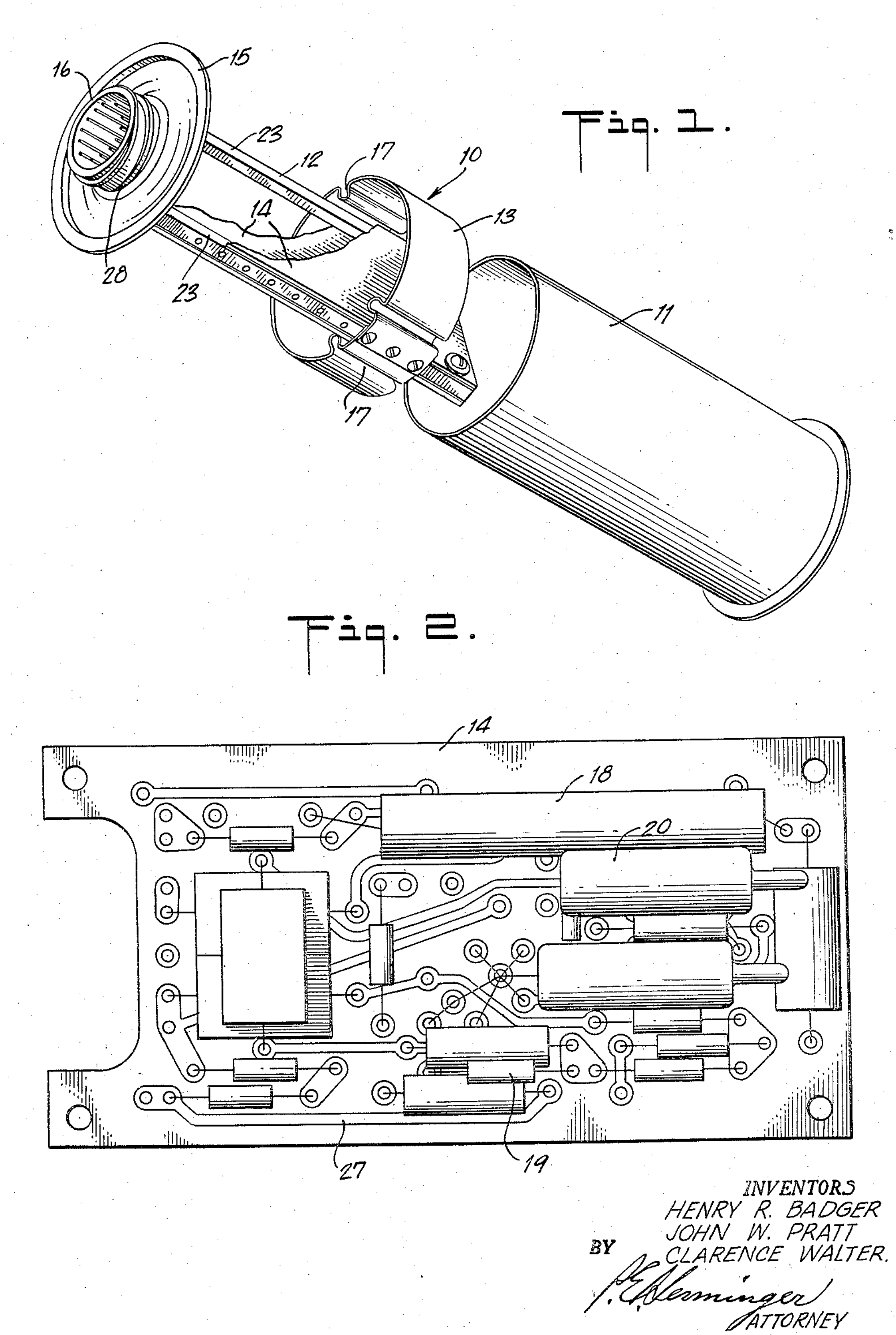
Figure 1 is a perspective view of the frame, lid and can of the device of this invention in exploded relationship.
Fig. 2 is a plan view of one of the assembled component boards of this invention.

Referring more specifically to the figures, Fig. 1 is a perspective view of a circuit carrying assembly 10 and a can 11 which is in an exploded position in respect to the assembly 10. The assembly 10 is made up of a frame 12 (which consists of 2 boards 14 and 2 spacers 23) on which is mounted a spring band 13, a lid 15, and a plug connector 16. The frame 12 and its associated parts are insertable into the can 11, so that the lid 15 closes the open end of the can 11. In fitting into the can 11, the spring band 13 is provided with resilient U-bends 17 to allow compression of the spring band on insertion into the can 11 and expansion of the band 13 when in position. This spring expansion of the spring band 13 serves to hold the frame 12 and its components spring mounted in the can 11 and also provides good thermal contact between the spring band 13 and the can 11.

In the plan view of Fig. 2 one of the boards 14 shows resistance components 18, condenser components 19 and tubes 20 mounted on a printed circuit 27 on the surface of the board 14.

Figure 3:
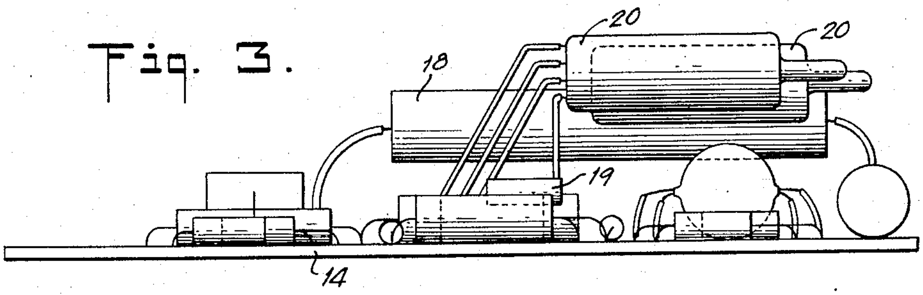
Fig. 3 is a side elevation of the component board assembly of Fig. 2.

In Fig. 3, the side elevation of the board 14 and its resistance components 18, condenser components 19 and tubes 20, show that two tubes 20 and a resistance component 18 are suspended away from the surface of the board 14. These components are thus positioned to provide a compact arrangement of the components of the electronic circuit. As they are mounted out of contact with the surface of the board 14, however, these components require other means for securement. This means is provided on the spring band 13.

Figure 4:
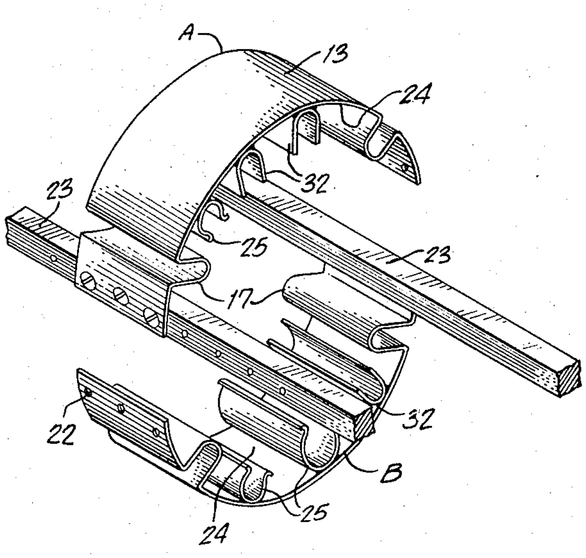
Fig. 4 is a perspective view of the spring band of the frame in partly detached condition to more fully show electrical component mounting members on the inner face thereof.

In Fig. 4, the spring band 13 is shown in disassembled condition. The spring band is made up of two halves A and B, each provided with holes 22 through which they are secured to the spacers 23 making up longitudinal members of the frame 12 as shown in Fig. 1. The spring band halves A and B each contain 2 U-shaped bends.

Figure 5:
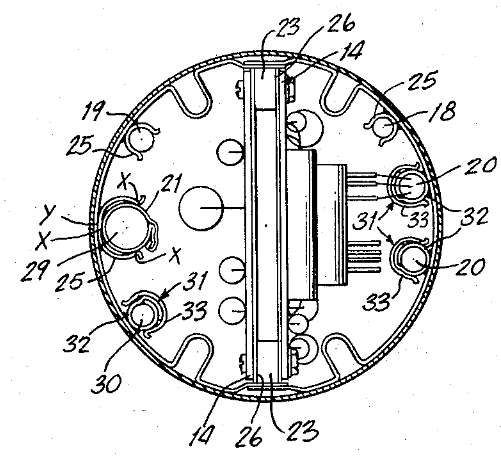
Fig. 5 is a radial section through the mounting apparatus of this invention in assembled form.
Figure 6:
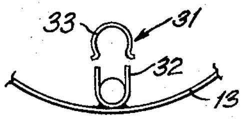
Fig. 6 is a radial view of a tube clip mounting for a sub-miniature tube in disassembled position.

Referring again to Fig. 4, an inner surface 24 of each half A and B of the spring band serves as a mounting for spring clips 25 with arcuate arms spaced slightly apart and having a resiliency to admit a cylindrical object and to hold it in clamped relationship against dislodgment. The cylindrical objects received in the spring clips 25 are components of the electrical circuit of the device of this invention. The spring band halves A and B are also provided with assemblies 31 as seen in Fig. 6 for supporting and containing smaller and more fragile objects. An assembly 31 is made up of a liner element 32 of good conducting material and a U-shaped clip cap 33. The liner element 32 is wrapped around electrical components such as tubes 20 and resistances 30 as shown in Fig. 5. The clip cap 33 overlies the liner 32 and gathers and crimps the liner 32 about the respective component, such as the tube 20 or the resistance 30.

The miniature tube 29, as shown in Fig. 5, is encased in a relatively soft copper sleeve 21 which is fitted to conform to the contour of the tube periphery. It will be readily understood that the tube with its sleeve 21 can be snapped into its respective spring clip 25 by moderate pressure and that when so sprung in and mounted, will be retained in its spring clip 25. The sub-miniature tube 20 and a glass resistance 30 are held in the assemblies 31.

In Fig. 5, the assembly apparatus is shown in a radial section. Two component boards 14 are mounted on opposite sides of the spacers 23 and are insulated from each other by sheets of Teflon 26. The electronic circuit is printed on the right board 14, as seen in Fig. 5, with its associated components distributed within the can 11 and mounted in the spring band 13 as described above. The spring band 13 halves A and B are tightly fastened on the spacers 23 between the component members 14. The spring bands 13 are expanded against the interior of the can body to hold the electronic circuit securely in position.

The sub-miniature tubes 20 are shown mounted in their assemblies 31 on the right side of the assembled device, as shown in Fig. 5. To properly hold the sub-miniature tubes 20 and the glass resistance 30, this invention, as shown in Fig. 6, provides the assembly 31 with a liner element 32 of good conducting material and a U-shaped clip cap 33 which overlies the liner 32 and gathers and crimps the liner 32 about the tube 20 or the resistance 30 to provide a tight and close contact with the wall of the sub-miniature tube 20 or resistance 30. The liner 32 is attached to the inner surface 24 of the spring band 13 and retains its component in position. The gathering and crimping action of the outer clip cap 33 on the liner 32 provides good thermal contact of the metal liner with the wall of the tube 20. The other components are held in their respective spring clips 25 by snapping the components into the spring clips 25, and thereby encased in their respective soft copper sleeves 21. When the component resistances, condensers and tubes are thus snapped into the spring clips 25, the spring clips bear most heavily against the sleeves 21 at the points indicated by the letter X, in connection with the tube 29, shown on the left side of Fig. 5. This pressure exerted by the encasing arms of the spring clips 25 causes the components, such as the tube 29, to be brought into firm contact with the spring clips 25 adjacent its point of attachment to the inner surface 24, indicated by Y in Fig. 5. Thus, the grip of each of the spring clips 25 on its respective component and the pressure of the spring clip arms against the copper sleeve 21 increases and insures the thermal contact of the component with the spring band 13. Under this pressure, the copper sleeve 21 tends to adapt itself to the periphery of the component, as mentioned above. This conformation increases the thermal conductivity and possible thermal transfer between the respective component and its sleeve 21. The spring clip 25 and the liner 32 are suitably attached to the inner surface 24 of the spring band 13, so as to provide good thermal contact with the spring band 13. As a result, it will be seen that the heat from the components may be conducted through the sleeves 21 and liner 32 to the spring band 13. This dissipation of heat reduces the tendency of over heating of the compact components encased in the can 11.

According to this invention, the lid 15 is hermetically sealed to the can 11. The can 11 is evacuated through a small hole, not shown, provided at the opposite end of the can and flushed with helium or other inert gas under pressure to provide an inert atmosphere. The can is sealed and checked for leaks at the completion of the assembly to provide a unit which is well protected against corrosion and other disturbing atmospheric conditions.

Referring again to Fig. 2 and the component member shown therein, the printed electrical circuit 27 is prepared on the board 14 by coating a glass base laminate with a copper surface and printing the electrical circuit on the copper coating. By an etching process, the copper coating is removed from the glass base laminate in the areas not covered by the printed electrical circuit. This leaves the copper only in the printed circuits and provides the printed electrical circuit on the board. The holes for the components of the electronic circuit are then drilled or punched in the board and the electrical circuit. The drilled holes are plated to complete preparation of the electrical circuit for the reception of the components. The electronic components are then assembled on board 14 as shown in Figs. 2 and 3.

Referring again to Fig. 1, the can lid 15 and the plug unit 16 are assembled by placing the plug connector 16 in an aperture 28 in the can lid 15. A bracket assembly with clinch nuts is set over the plug unit 16 and is locked in place with a connector nut. The plug unit 16 is hermetically sealed with solder on the outside of the lid to complete the can lid assembly. The component board assemblies are wired in the plug unit and mounted on the frame 12, being insulated therefrom by the Teflon layers 26. This is followed by a mounting of the spring member 13 on the frame 12 as described above and completing the asembly of the components of the electronic circuit.

This invention provides a pluggable unit which is simply assembled and securely held together. Of the elements of this unit only the can body and the can lid must be destroyed upon disassembling the assembled parts. A further advantage is found in the fact that the pluggable unit is self-contained, easily stored, and replaced. Further, the electronic circuit and its components can be easily electrically checked before being hermetically sealed in the can.

The spring clips and the spring bands contribute at least two advantages to the unit. As indicated above, the spring bands and the spring clips provide secure support for the electronic circuit and its components. Also, the tight clips engaging the electron tubes and the high power resistors provide cooling through the clips, the spring bands and the inside of the can 11 which is preferably composed of copper. The manner of mounting the larger and hotter components adjacent the wall of the enclosure and in good thermal contact therewith, assists in the cooling of the electronic circuit by the device of this invention. The mounting of the large components having a weight of over ½ ounce on the inner surface of the spring band, in addition to providing for good heat conduction through the can wall, also permits better arrangement of the parts within the enclosure.

The electrical or electronic parts which are enclosed in a receptacle, such as can 11, may be arranged with greater efficiency as a result of this invention. The tubes may be arranged with their leads in more desirable locations with respect to the printed wiring boards and thus the arrangement may facilitate wiring assembly. A larger number of tubes may be stored within the enclosing can. The components may be assembled by sub-assemblies, and the sub-assemblies assembled into the final unit, which is an aid to mass production methods. Electrical testing may be performed prior to insertion of the assembly in the can after all the components have been positioned in their permanent physical locations. Also, the sub-assemblies may each be tested to cut down loss through shrinkage in the production steps. These advantages, together with the great economy of space provided by the final assembly, results in a device of great utility.

The above-described embodiment of this invention is for the purpose of illustration. Modifications of the various elements of the structure may be made without departing from the spirit of the invention. For example, the specific means for mounting the components on the spring band surface may be modified to any structure which holds the components in good thermal contact with the enclosure wall. Also, more than one spring band carrying large components may be mounted on one frame. Accordingly, it is intended to limit this invention only by the scope of the appended claim.

What is claimed is:

A heat dissipating mounting unit for electrical components comprising: a rectangular component mounting board, a resilient tubular component mounting band of heat conducting material mounted on said board in coaxial relation therewith, a plurality of inwardly extending U-bends in said resilient tubular component mounting band whereby the normal diameter of said band may be reduced by compression thereof, an enclosure cover mounted at one end of said board, component mounting clips of heat conducting material mounted on the inner face of said component mounting band and fixed thereto in thermal contact therewith, and an enclosure cylinder of heat conducting material having a closed end and an open end adapted to wholly receive and enclose said component mounting board and said component mounting band when said enclosure cover is in contact with the open end of said enclosure cylinder, the normal diameter of said component mounting band being greater than the internal diameter of said enclosure cylinder such that compression of said band is required for the insertion of the same into said enclosure cylinder and whereby the resilience of said band holds it in thermal contact with said cylinder.

References Cited in the file of this patent

UNITED STATES PATENTS

| | | |
|---|---|---|
| 2,313,379 | Wood | Mar. 9, 1943 |
| 2,321,161 | Sickles | June 8, 1943 |
| 2,526,834 | Traugott | Oct. 24, 1950 |
| 2,647,224 | Bruck | July 28, 1953 |
| 2,683,785 | Miller | July 13, 1954 |
| 2,766,020 | Woods | Oct. 9, 1956 |
| 2,771,278 | Slack | Nov. 20, 1956 |
| 2,787,735 | Scal | Apr. 2, 1957 |

FOREIGN PATENTS

| | | |
|---|---|---|
| 647,442 | Great Britain | Dec. 13, 1950 |